United States Patent [19]
Lin

[11] Patent Number: 6,134,149
[45] Date of Patent: Oct. 17, 2000

[54] METHOD AND APPARATUS FOR REDUCING HIGH CURRENT DURING CHIP ERASE IN FLASH MEMORIES

[75] Inventor: Tien L. Lin, Saratoga, Calif.

[73] Assignee: Integrated Memory Technologies, Inc., Santa Clara, Calif.

[21] Appl. No.: 09/260,996

[22] Filed: Mar. 1, 1999

[51] Int. Cl.[7] .................................................. G11C 16/04
[52] U.S. Cl. ............................ 365/185.29; 365/185.18; 365/185.24; 365/185.33
[58] Field of Search .................... 365/185.29, 185.18, 365/185.11, 185.24, 185.3

[56] References Cited

U.S. PATENT DOCUMENTS

| | | | |
|---|---|---|---|
| 5,444,655 | 8/1995 | Yoshikawa | 365/185.23 |
| 5,568,419 | 10/1996 | Atsumi et al. | 365/185.3 |
| 5,627,838 | 5/1997 | Lin et al. | 714/718 |
| 5,699,298 | 12/1997 | Shiau et al. | |
| 5,818,761 | 10/1998 | Onakado et al. | 365/185.18 |
| 5,818,848 | 10/1998 | Lin et al. | 714/718 |
| 5,896,319 | 4/1999 | Takehana | 365/185.29 |

*Primary Examiner*—David Nelms
*Assistant Examiner*—Gene N. Auduong
*Attorney, Agent, or Firm*—Ronald L. Yin; Limbach & Limbach LLP

[57] ABSTRACT

A method and an apparatus is provided to decrease the erase current level by subdividing the memory array into small segments and cycle through complete address space sequentially during the chip erase operation. Therefore, the transient erase current is proportionally reduced and is still within the current driving capability of an on-chip pump when a smaller memory segment is chosen. Furthermore, a chip erase operation can be divided into two stages. During the first stage of the chip erase operation, chip erase current is high and is supplied through a $V_{CC}$ power supply that can deliver a high current, but not a high enough voltage to ensure sufficient erasure of memory cells. During the second stage of the chip erase operation, the erase current is much lower and is supplied through an on-chip charge pump that can deliver much higher voltage than the $V_{CC}$ power supply to ensure the memory cell array is properly erased.

7 Claims, 10 Drawing Sheets

METHOD AND APPARATUS FOR REDUCING HIGH CURRENT DURING CHIP ERASE IN FLASH MEMORIES

TECHNICAL FIELD

The present invention relates to flash memories, and more specifically, decreasing the chip erase current level.

BACKGROUND OF THE RELATED ART

Flash memories have revolutionized the way system designers store digital control code and data. Flash memory technology offers a unique combination of features, non-volatility, in-system reprogrammability, and high-density.

Its non-volatile nature allows for the data stored in the memory cells to be retained even without power. It is similar to an EEPROM in that it is electrically erasable. The differences being primarily in density and granularity. EEPROMs are usually smaller, and byte erasable/writable, whereas flash memory is usually bigger, and block erasable/writable (blocks are groups of bytes, usually in multiples like 4K, 16K, etc.). In this respect, erasing and writing whole blocks at a time make flash memories faster than EEPROMS.

However, flash memory is not without its difficulties. Due to its nature, only a limited number of write/erase cycles can be performed. That is, the devices will actually wear-out with repeated use. The very thin layers involved (especially the tunnel oxide) eventually lose their capability to retain a charge.

With increasing usage and subsequently higher cycle counts, a block's program and erase performance degrades because of the trapped charge in transistor oxides and other stress phenomena. Eventually, the entire block will become useless.

Other disadvantages of flash memories are that they are slow compared to RAM, especially on write and erase functions. Additionally, some devices allow small numbers of bad blocks, analogous to having a few bad sectors on a disk drive.

There are several variants to flash memory. The two most common types are NOR and NAND. These names refer to details of the internal transistor structure, and the internal differences result in corresponding behavioral differences. While there is some overlap, each of these architectures is best suited to different applications.

NOR flash memory is random accessible. The information it contains can be read, and re-read, in any sequence or order. This makes it well suited for code-storage applications. NOR architectures provide a parallel internal architecture which enables fast random access to any location within the array for reads.

NAND flash is sequentially accessible. The information it contains is read in sequence, one bit (or byte) following the next, in order. This makes it poorly-suited for code-storage applications, but is made-to-order for data or file storage applications. NAND internal architectures comprise rows of transistors connected together serially. The resultant random access time is comparatively longer than that of parallel-architecture flash memory, because the memory must first sequentially sense and transfer data within each cell in the row to an on-chip buffer. However, subsequent access within the buffer is as fast as that of a parallel-architecture memory.

The design of the flash memory incorporates the floating gate of the EEPROM and hot electron injection for the write process with Fowler-Nordheim tunneling for the erase process. The charge injection process removes or adds electrons from the floating gate. The floating gate provides a gate voltage similar to a single-gate transistor, providing logic ONEs or logic ZEROs. That is, when the floating gate is strongly programmed to a positive charge, the floating gate transistor's channel becomes highly conductive. This state corresponds to a binary digit, such as logic ONE. On the other hand, when the floating gate is strongly programmed to a negative charge, the cell becomes non-conductive. This state corresponds to a binary digit, such as a logic ZERO. The cell volume is about the size of an EPROM, and the chip layout involves the erase of a section on the chip (unlike the bit-by-bit erase of the EEPROM).

The two main techniques used to alter the data stored in a flash-memory cell are channel-hot-electron (CHE) injection and Fowler-Nordheim (FN) tunneling. In each case, an applied electric field adds or removes electron charge from the transistor's floating gate, changing the threshold voltage. A subsequent read at a consistent reference voltage turns on some transistors, which may result as a ONE or a ZERO at the memory output, and leaves off others. Both approaches use high voltages either from the outside world or from internal, on-chip charge pumps.

Some CHE-based flash memories draw electrons from the source junction, others from the drain. CHE places no significant stress on the oxide layer below the floating gate, ensuring high reliability through extended cycling. CHE shortcomings include fundamentally low-efficiency programming, which high internal voltages and electric fields sometimes overcome, with subsequent high current draw. Whereas write performance is not a primary concern for infrequently updated code, it is often crucial for data and file-storage applications.

All flash technologies use FN tunneling for erasing, and non-NOR technologies employ it for both programming and erasing. FN offers focused electron transfer; it directly adds or removes charges to or from the floating gate. This characteristic manifests itself as low-current programming and erasing, which enables high-efficiency and low-power operation, shrinking on-chip voltage pump size. Depending on the technology, FN electron tunneling occurs between the floating gate on one side, and the substrate, drain, source or optional erase gate on another.

Fowler-Nordheim tunneling, or field emission, is the process whereby electrons tunnel through a barrier in the presence of a high electric field. During the erase process, an erasing potential is applied in parallel to the entire array, or to large sectors of the array. The primary current in the erase process generated by this potential is this Fowler-Nordheim tunneling current, by which electrons are driven from the floating gate of the memory cell.

Another source of current during the erasing procedure is known as band-to-band tunneling. This results in current into the substrate (or source/drain), and current in the form of unwanted holes stay in an area about 15–30 Angstroms away from the surface of the silicon. Referring to FIG. 1, a conventional chip erase method is shown. Initially an erase timer 150 is started, step S1. Then, the $A_{RVSS}$ current pump path is turned on, step S2. Next, a query loop, step S3, is initiated, checking whether the erase timer 150 has expired. Step S3 continues until the result of this query is YES. At that time, the high voltage is discharged, step S4, and the chip erase method ends. Step S4 can be controlled by a timer or an internal circuit delay. Further, Since over erase is not of concern, there is no erase verification in the loop of FIG. 1.

It has been known, for example in Shiau et al., U.S. Pat. No. 5,699,298, that the use of a negative gate potential during the erase process allows use of a lower source voltage. The lower source voltage suppresses avalanche breakdown and improves endurance and reliability of the cell.

However, the band-to-band current is still about 10 nA per memory cell at the beginning of the erase operation when the cell is in a high threshold state. Thus, for a 2 Mb flash memory, erase transient current is about 20 mA at the beginning of a chip erase operation. For a single voltage source flash device, this high current is generated from a charge pump which can boost voltage but only has a limited current driving capability unless a very large pump capacitor is used in the design. Furthermore, for a low $V_{CC}$ (3.3V and lower) flash memory device, the problem is increasingly worse.

Thus, it would be desirable to reduce the transient erase current while maintaining the significant current driving capability of an on-chip charge pump.

SUMMARY OF THE INVENTION

A method is provided to decrease the erase current level by subdividing the memory array into a plurality of smaller memory segments and cycle through complete address space sequentially of the plurality of memory segments during the chip erase operation. Therefore, the transient erase current is proportionally reduced and is still within the current driving capability of an on-chip pump when a smaller memory segment is chosen.

Furthermore, the chip erase operation may be divided into two stages. During the first stage of the chip erase operation, chip erase current is high and is supplied through a $V_{CC}$ power supply that can deliver a high current, but not a high enough voltage to ensure sufficient erasure of memory cells. During the second stage of the chip erase operation, the erase current is much lower and is supplied through an on-chip charge pump that can deliver much higher voltage than the $V_{CC}$ power supply to ensure the memory cell array is properly erased.

DETAILED DESCRIPTION OF THE INVENTION

Figure 1:
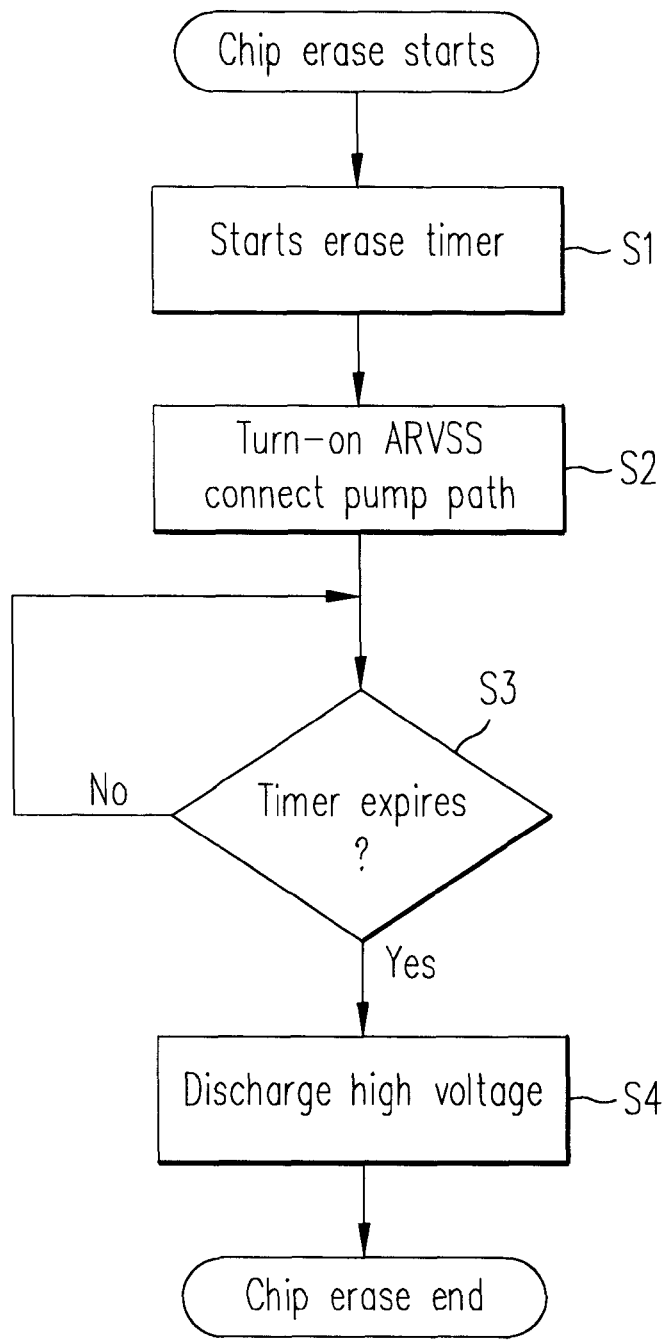
FIG. 1 is a flowchart of the prior art chip erase method.
Figure 2:
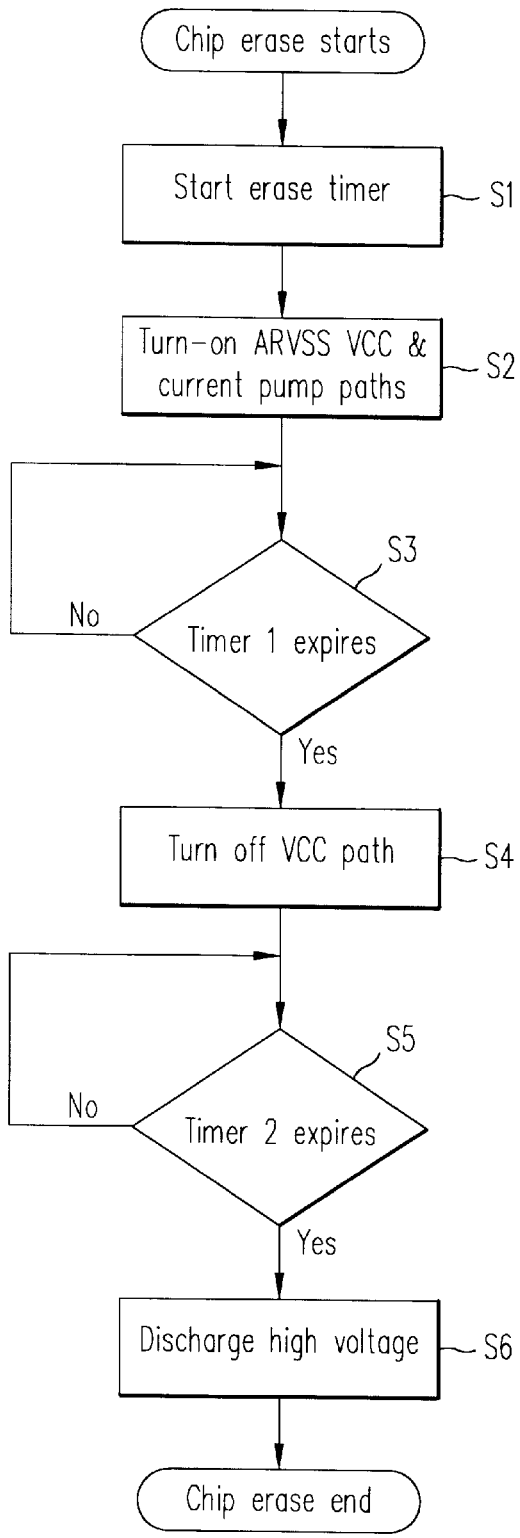
FIG. 2 is a flowchart of the dual-voltage source method to chip erase contemplated by the invention.

FIG. 2 shows the dual-voltage source approach to the chip erase method contemplated by the present invention. Although the method of the present invention is preferably applied to a memory cell of the type disclosed in U.S. Pat. No. 5,668,757, whose disclosure is incorporated herein by reference, the method of the present invention can be practiced with any other type of flash memory cell, which exhibits band-to-band tunnel current during erase. In particular, band-to-band tunnel current occurs when electrons tunnel from the floating gate through an oxide layer into the substrate (or the source/drain within the substrate). As density of memory cells increases, the band-to-band current will also increase. Thus, the method and apparatus of the present invention can be used in memory chips exhibiting band-to-band tunneling current.

In the method of the present invention, initially, an erase timer 250 is started, step S1. Then, the $A_{RVSS}$, $V_{CC}$ and current pump paths are all turned on, step S2. The $A_{RVSS}$ voltage is the high voltage, low current from the charge pump supplied to the source of the memory cells in the same row, as disclosed in U.S. Pat. No. 5,668,757. Typically, the $A_{RVSS}$ voltage is on the order of 7.5 volts and can support less than 500 microamps when $V_{CC}$ is at 3.3 volts. The $V_{CC}$ is the external voltage which has a high current capacity. Typically, $V_{CC}$ is on the order of 3.3 volts and can supply current on the order of 20 milliamps.

After the $A_{RVSS}$, $V_{CC}$ and current pump paths are all turned on, a first query loop, step S3, is initiated, determining whether the first erase timer 250 has expired. Step S3 continues until the result of this query is YES. At that time, the $V_{CC}$ path is turned off, step S4. Then, a second query loop, step S5, is initiated, determining whether a second erase timer 250 has expired. Step S5 continues until the result of this query is YES. At that time, the current pump path is turned off and the high voltage is discharged, step S6, and the chip erase method ends.

Figure 3:
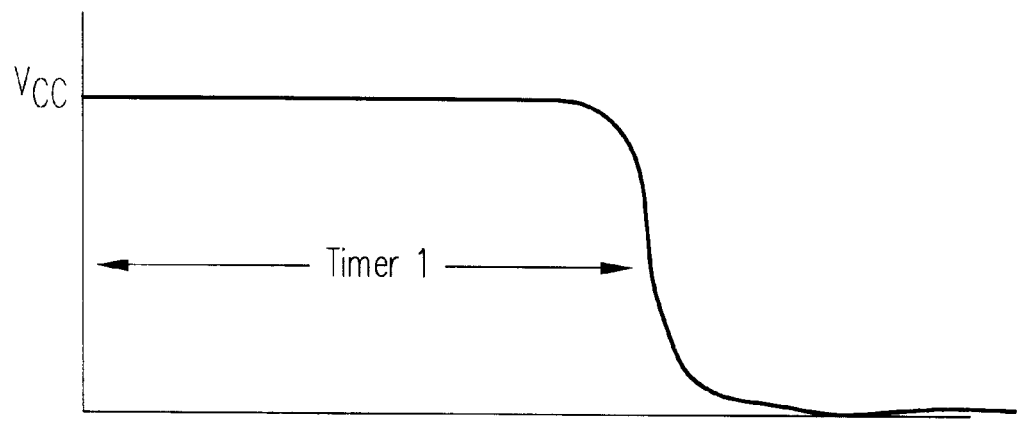
FIG. 3 is a logic diagram of the logic levels $V_{CC}$ and the high voltage, HiV, for the dual-voltage source method to chip erase.
Figure 3:
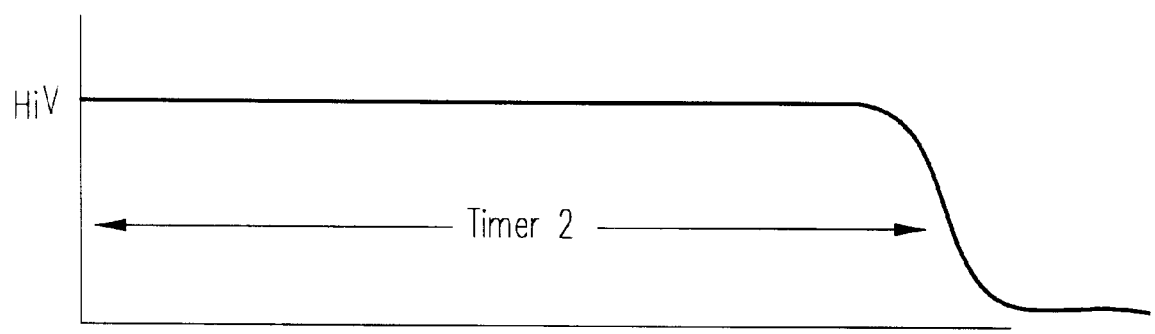

FIG. 3 shows the resulting voltage levels of $V_{CC}$ path and high voltage, HiV path, during the dual-voltage source method to chip erase shown in FIG. 2. Note that HiV is not discharged until after $V_{CC}$ path is turned off.

Figure 4:
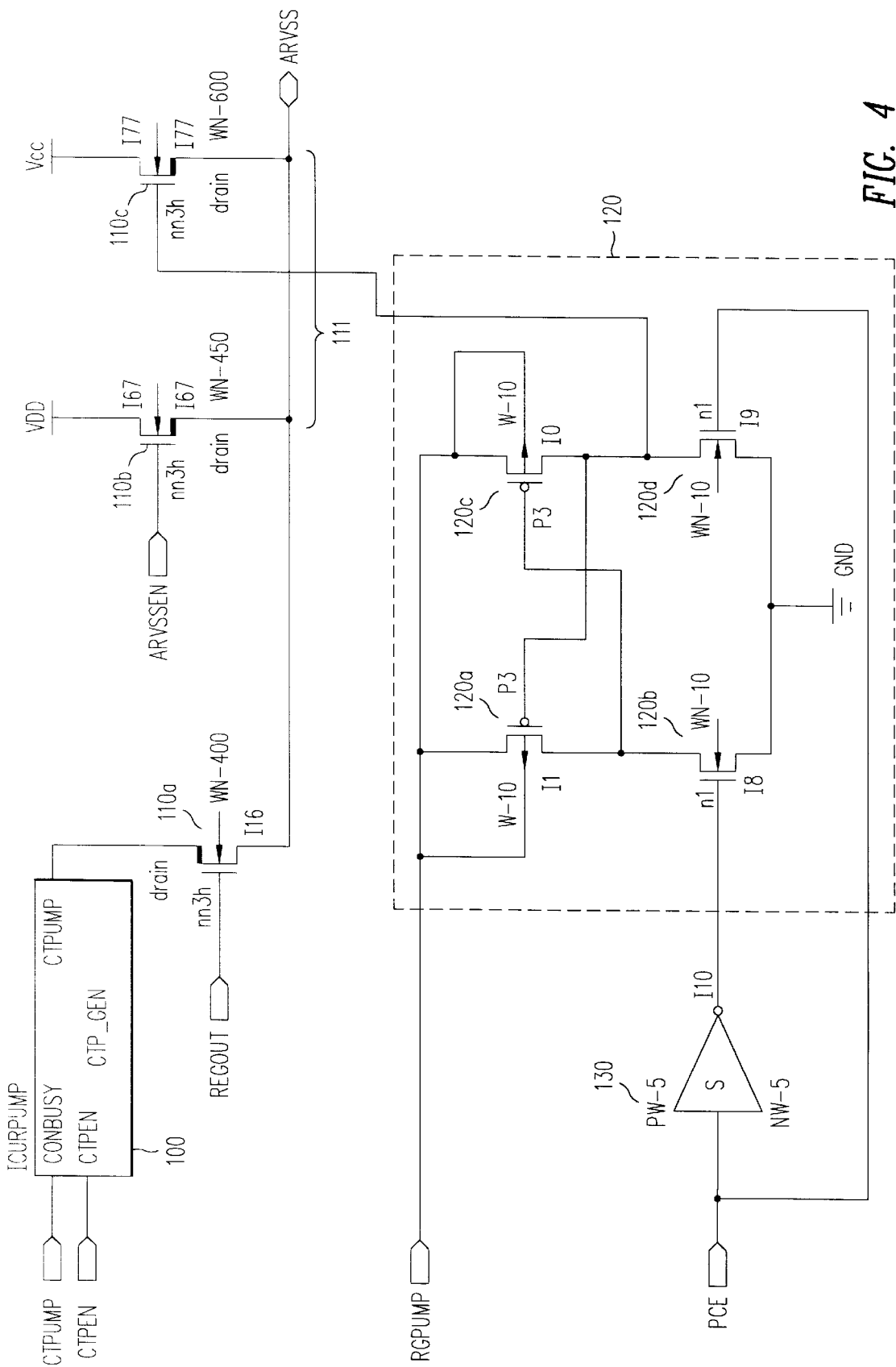
FIG. 4 is a circuit diagram of a circuit capable of performing the dual-voltage source method of chip erase.

FIG. 4 shows a circuit schematic of a circuit capable of performing this dual-voltage chip erase. Referring to FIG. 4, the current pump generator 100 has two inputs CTPUMP and CTPEN, and an output CTPUMP. When the charge pump 100 is operational, CTPUMP is on the order of 7.5 volts. FET transistor 110a is regulated by the signal REGOUT. When REGOUT is on the order of 9.0 volts, the 7.5 volts from CTPUMP is supplied to the node ARVSS. REGOUT is activated when HiV is supplied during the timer period 2.

The source terminals of FET 110c is connected to voltage source $V_{CC}$, whereas the drain terminal of FET 110c is connected to the terminal ARVSS. Transistor 110c is activated by the output of a CMOS latch 120.

The CMOS latch 120 is composed of four FETs 120a–d. FETs 120a and 120c are p-channel enhancement transistors, whereas FETs 120b and 120d are n-channel transistors. That is, FETs 120a and 120c will be switched OFF when a high gate potential is encountered. FETs 120b and 120d will be switched OFF when a low gate potential is encountered.

The CMOS latch 120 is connected such that the source terminal of FET 120a is connected to signal RGPUMP. The drain terminal of FET 120a is connected with the drain terminal of FET 120*b*. FET 120*b* has its source terminal connected to ground and the gate terminal is connected to signal line PCE after passing through an inverter 130. Therefore, FETs 120*a* and 120*b* comprise an inverter. The output of which is connected to the gate terminal of FET 120*c*. Like, FET 120*a*, FET 120*c* also has its source terminal connected to signal line RGPUMP. The drain terminal of FET 120*c* is connected with the drain terminal of FET 120*d*, such that FETs 120*c* and 120*d* comprise another inverter, the output of which happens to be connected with the gate terminal of FET 120*a*. FET 120*d* has its gate terminal connected to signal line PCE and its source terminal is connected to ground. Therefore, the gate terminals of FETs 120*b* and 120*d* receive complementary signals, due to inverter 130.

The output from the CMOS latch 120 is connected to the gate terminal of FET 110*c*. Thus, FET 110*c* will be switched OFF whenever the output of CMOS latch 120 is LOW.

Thus, during the first time period of the two-stage chip erase operation, CTPEN is enabled and CTPUMP is at 7.5 volts, REGOUT is at 9.0 volts, and is supplied to the node ARVSS. PCE is low; RGPUMP is at 10v during erase and the gate voltage of FET 110*c* is at 10.0 volts. However, node ARVSS is also connected through transistor 110*c* to $V_{CC}$, which is at approximately 3.3 volts. Therefore, node ARVSS will be at approximately 3.3 volts. However, because $V_{CC}$ can supply a large current to ARVSS, during this time period, the current needs of ARVSS is supplied from $V_{CC}$. Thus, the $V_{CC}$ current path is supplied from the $V_{CC}$ voltage through transistor 110*c* to node 111.

After the first time period and during the second time period, PCE is high and transistor 110*c* is turned off, leaving ARVSS connected to CTPUMP. CTPUMP, as previously discussed, supplies a high voltage (on the order of 7.5 volts) but at a lower current to the node ARVSS. Thus, the Hi Voltage current path is from the current pump 100 through transistor 110*a* to node 111.

The theory of the present invention is as follows. As previously discussed, the present invention solves the problem of high band-to-band tunnel current required during erasure. During the initial phase of an erase operation for a chip having memory cells susceptible to band-to-band tunnel current phenomenon (i.e. electrons tunneled from the floating gate to the source/drain or the substrate), because the band-to-band current is larger in the initial phase than in the later phase of the erase operation when memory cells are gradually erased. The requirement for current is higher during this initial phase than during the later phase. Therefore, even though during the initial phase the voltage is not high enough to cause tunneling of the electrons from the floating gate to the substrate (or source/drain), the voltage supplied is high enough to supply the current for band-to-band tunneling. During the later phase of the erase operation when the band-to-band current is reduced, the reduction in the current supply is sufficient to cause the charge pump voltage alone to supply the necessary current (and voltage) to tunnel the electrons from the floating gate to the substrate (or source/drain). Finally, the discharge of the high voltage ARVSS removes the high voltage from the various lines, such as the source lines which connect the memory cells to the node ARVSS.

Figure 5:
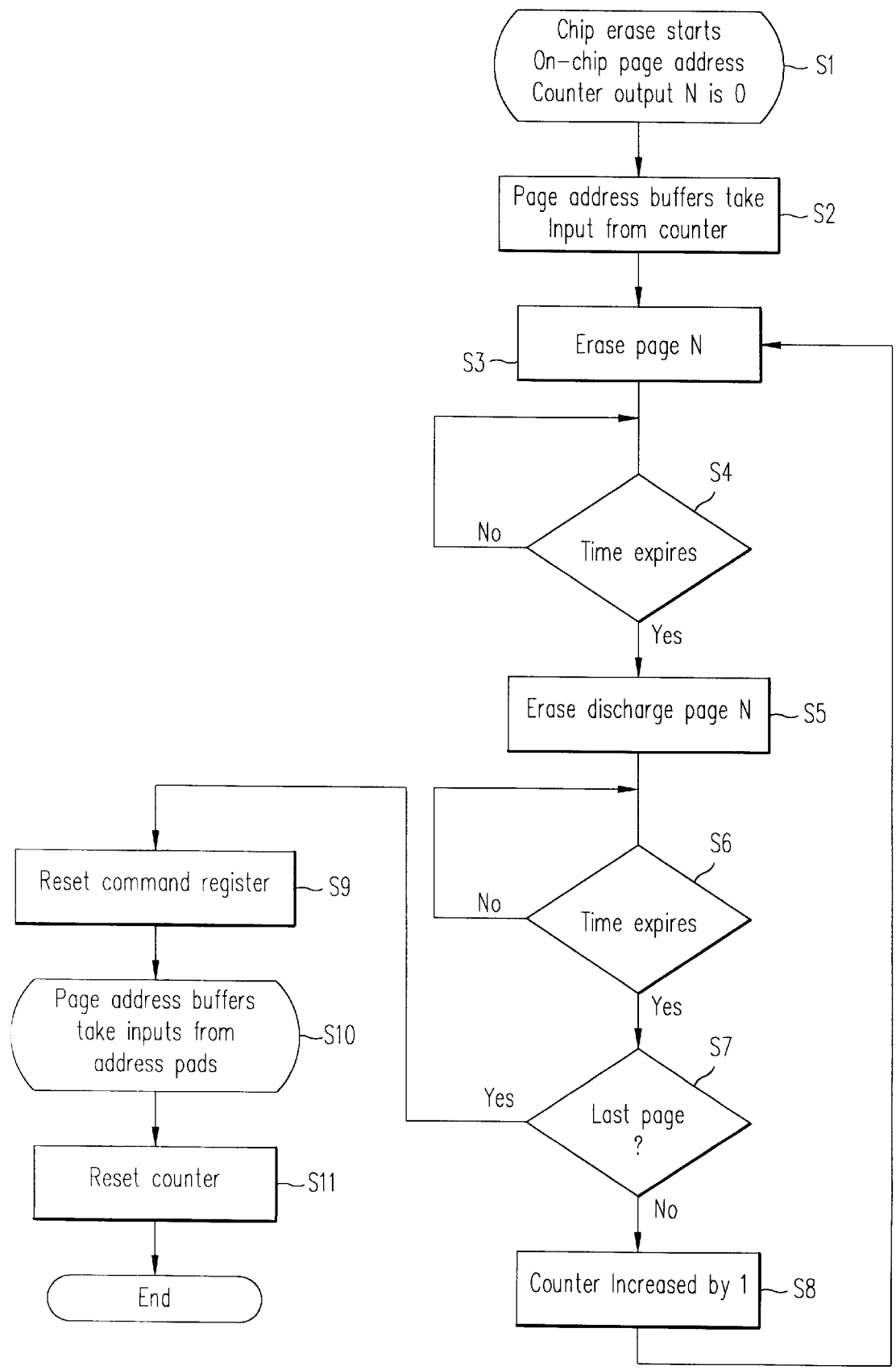
FIG. 5 is a flow chart of the cycle-through chip erase method contemplated by the invention.

In another method of chip erase of the present invention, the cycling through method, will be discussed with reference to FIG. 5. After the chip receives the CHIPERASE command, initially, the on-chip page address counter 270 output is set to "0," step S1. In the next step, step S2, the page address buffer 280 takes the output from the counter 270. Then, the page number associated with the counter 270 output is erased, step S3 and erase high voltage is applied. Next, at step S4 after the timer expires either though a timer circuit or a delay circuit (such as an RC delay circuit), the erase high voltage is terminated. At step S5, the page number associated with the counter 270 output is discharged. Then, at step S6 after the timer expires either through a timer circuit or a delay circuit (such as an RC delay circuit) the high voltage discharge is terminated. Next, a query, step S7, determines whether the page address counter 270 indicates a "last page." If the result of this query is NO, the on-chip page address counter 270 output is incremented by "1," step S8, and the cycle-through chip erase returns to step S3. If the result of this query is YES, then the command register 210 is reset, at step S9 to terminate the chip erase operation. Then, the page address buffers 280 take inputs from the address pads 290, step S10, and the on-chip page address counter 270 is reset, step S11.

In this method, when a "block" of memory is to be erased simultaneously, within the integrated circuit, there is provided circuitry (as explained in detail hereinafter), to divide the specified "block" into a plurality of "pages" or smaller units of memory with all the memory cells in a "page" erased simultaneously, and with the circuitry automatically sequencing the erasure of each of the pages. Thus, to a user, the integrated circuit appears to erase the memory cells of a "block" simultaneously. However, because the erasure is only of all the memory cells of a "page" simultaneously, erase current is lower. Further, with the memory cell of the type disclosed in U.S. Pat. No. 5,668,757, which can be erased relatively "fast," the degradation in total erase time with the present method is not appreciably noticeable. In addition, of course, this method can be combined with the method and apparatus of erasure as disclosed above regarding reduction of band-to-band current.

Figure 6:
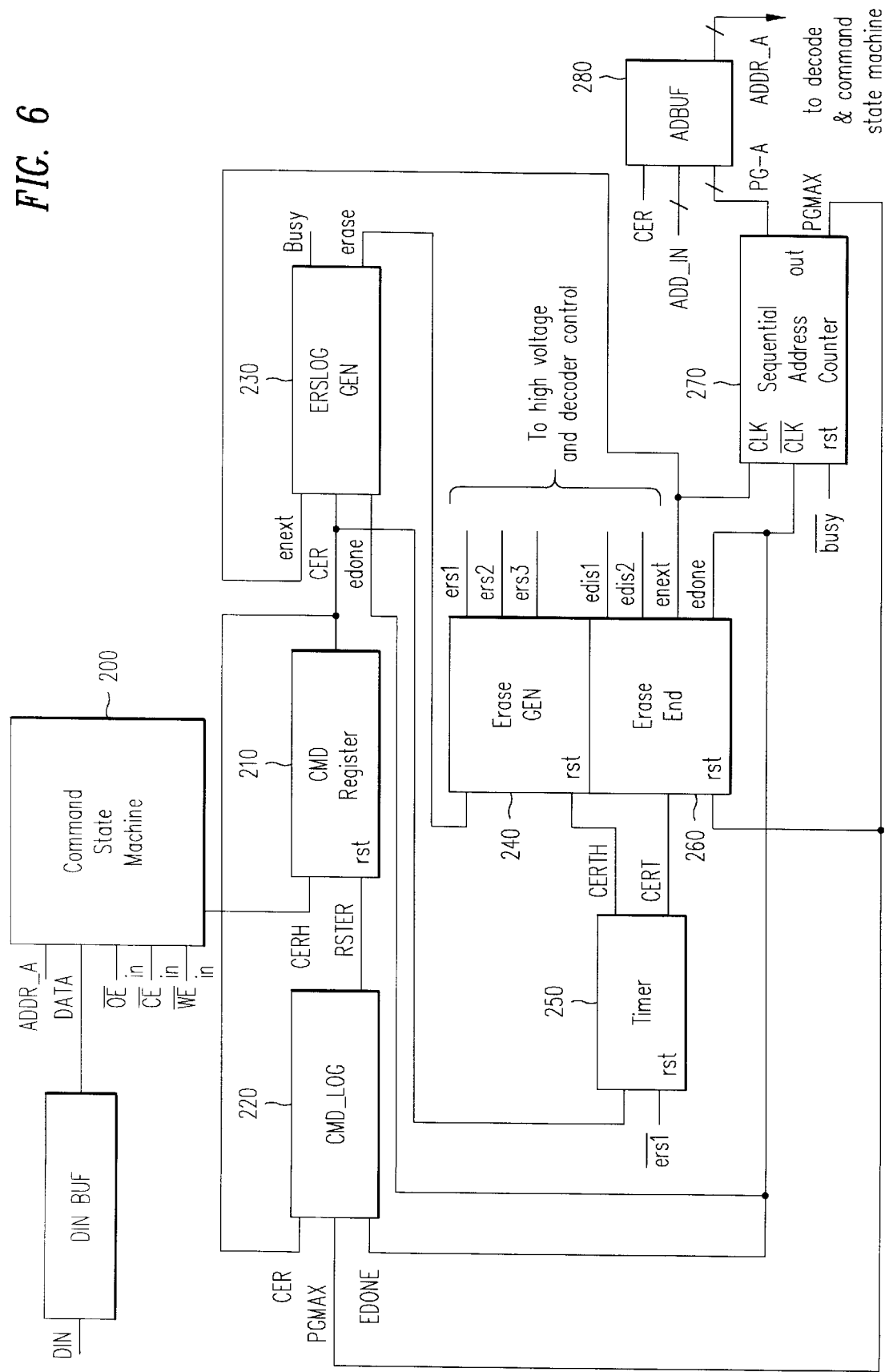
FIG. 6 is a block diagram of a system capable of performing the cycle-through chip erase method.

FIG. 6 shows a block diagram of a circuit capable of performing the method of cycle-through chip erase described above. A command state machine 200 has five inputs, ADDR_A, DATA, $\overline{OE}_{in}$, $\overline{CE}_{in}$ and $\overline{WE}_{in}$. Depending on these inputs, the command state machine 200 generates one output CERH. When CERH is high it indicates Chip erase command is applied. When CERH is high, it will set the output CER of the command register 210. The output of command register 210 is also set (reset) by RSTER, which resets the chip erase operation. RSTER is the output of the CMD_LOG 220, which has three inputs, CER, PGMAX, and EDONE. RSTER is used to reset the chip erase operation when CER, PGMAX are high and EDONE pulse occurs.

As previously described, from these three inputs, the CMD—LOG 220 generates an output signal RSTER which becomes the second input to the command register 210. The command register 210 then provides signal CER (which is a global chip erase signal) to the ERSLOG generator 230, which has two additional inputs, ENEXT and EDONE. The ERSLOG generator 230 generates an output signal ERASE which in turn becomes one of two inputs to the erase generator 240, and an output signal BUSY.

A timer 250 receives the signal CER as one input, and $\overline{ERS1}$ as another input signal, and generates two outputs, CERT and CERTVC. Output CERTVC from the timer becomes the second input to the erase generator 240. The erase generator 240 then generates three output signals, ERS1, ERS2 and ERS3.

An ERASE END circuit 260 has two inputs, CERT, which is one of the outputs of the timer 250 and PGMAX. This ERASE END 260 then generates four outputs, EDIS1, EDIS2, ENEXT and EDONE. All three of the outputs from the erase generator 240 and two of the outputs from ERASE END 260, i.e. ERS1, ERS2, ERS3 and EDIS1 and EDIS2, are supplied to the high voltage and decoder control logic (not shown).

A sequential address counter 270 has three inputs, EDONE and ENEXT, which are two of the outputs of ERASE END 260, and a $\overline{BUSY}$ signal. The page address counter 270 has two output signals, PGMAX and PG_A. Signal PG_A is a bus signal of N addresses and are supplied to page address buffers 280 having additional inputs CER and ADD_IN. ADD_IN is also a bus signal supplying the external address inputs having a total of N input page addresses. The address buffer ADBUF 280 outputs signal ADDR_A having a total of N addresses outputs.

Operation of the circuit and command decoder described above will now be explained in order to more fully appreciate the invention. 1) Initially, the command state machine 200 receives a CER command sequence from address, data and control inputs, and chip erase begins. The global chip erase (CER) command signal (output of CMD register 210) goes high which sets BUSY to high indicating the chip is busy doing erase operation. 2) The Sequential Address Counter 270 is reset to all "0" when $\overline{BUSY}$ is high. When $\overline{BUSY}$ goes low, sequential Address Counter 270 is activated. The ADBUF 280 takes its inputs from the sequential address counter 270 instead of ADD_IN and page 0 of both the left and right arrays (of the memory array type disclosed in U.S. Pat. No. 5,699,298), are selected. The counter 270 waits for an increment signal. 3) The rising edge of the CER signal will generate a one shot signal to set ERASE signal to high. This starts the erasure of page 0. 4) The ERASE signal causes the generation of ERS1, ERS2 and ERS3 signals which are sequence signals used to control the generation of the on-chip high voltage pump and high voltage circuitry. 5) The Timer 250 which controls the chip erase time, is started by the signal CER and timer reset signal $\overline{ERS1}$ is low. The Timer 250 generates two time-out signals: CERTVC and CERT, which corresponds to S4 and S6 of the flowchart of FIG. 5. The CERTVC signal resets the ERS1, ERS2, and ERS3 signals to stop the high erase voltage and to start the internal high voltage discharge.

The CERT signal causes the generation of EDIS1, EDIS2 and EDONE signals to continue the high voltage discharge and to prepare the internal circuitry to low voltage operation state. 6) The ENEXT signal is generated by the EDONE signal. The ENEXT and EDONE signals are non-overlapping serve as Clock and $\overline{Clock}$ signals to advance the sequential address counter 270. 7) The EDONE signal resets the ERASE signal to complete the erase operation of page 0. The ENEXT signal increases the sequential address counter 270 by 1, and selects the next page (e.g. page 1 in this example) for the erase operation. The ENEXT signal also sets the ERASE signal high again to start the erase operation for the next page. 8) The ENEXT signal also causes the ERASE signal to be generated, which causes the ERS1, ERS2 and ERS3 signal to be generated, all as described above in steps 4–7. 9) The erase loop described above continues until the "last page" is indicated. 10) When the "last page" is selected for erasure, the PGMAX signal output from the sequential address counter 270 goes high. The PGMAX signal is connected to CMD_LOG 220 and ERASE END 260. 11) steps 4 and 5 are repeated for the erasure of the last page. 12) During the last CERT signal, since PGMAX is high, ENEXT signal will not be generated by the EDONE signal, and the sequential address counter 270 will not be incremented. The EDONE signal will reset the ERASE signal to indicate that the erasure of the last page is done, and since ENEXT signal is not generated, ERASE signal will not be set. Further, since the PGMAX signal is high, RSTER output from the CMD_LOG 220 will be generated. 13) The RSTER signal will reset the global chip erase signal CER indicating that the chip erasure operation is done and the BUSY signal will go low. The sequential address counter 270 is reset by the $\overline{BUSY}$ signal. The circuit ADBUF 280 receives the input from ADD_IN and the chip goes into a low voltage state. Timer 250 is then disabled.

FIGS. 7–10 show timing diagrams of the various representative signals and their logic levels during the dual voltage chip erase method and the cycle-through chip erase method.

Figure 7:
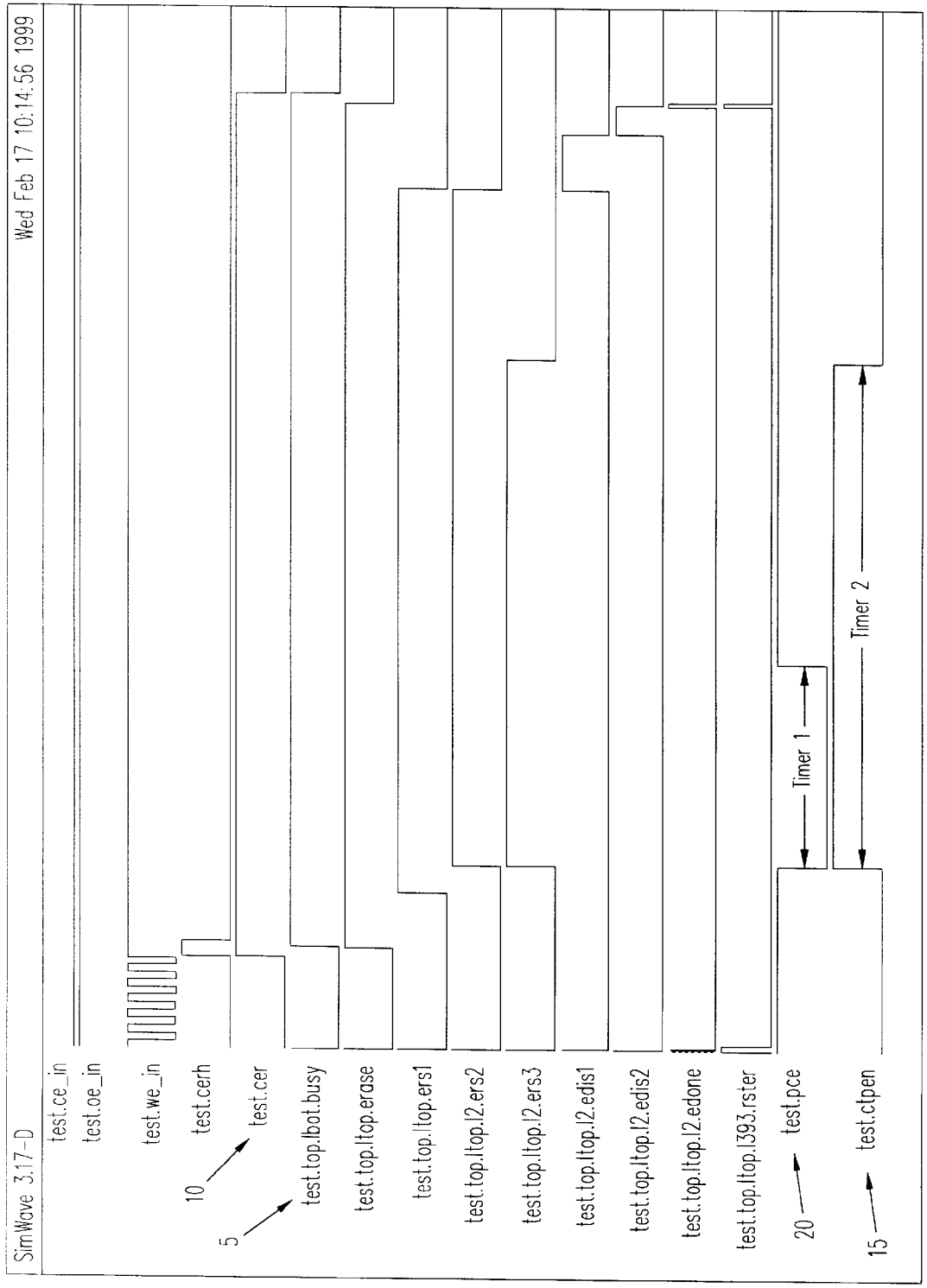
FIG. 7 is a timing diagram showing the logic states of the representative signals during a stage of the dual voltage chip erase method.

FIG. 7 is a timing diagram of the dual voltage chip erase method described in FIG. 2. The signals represented by reference numbers 5, 10, 15 and 20 represent the signals BUSY, CER, and the timers Timer1 and Timer2, respectively.

Figure 8:
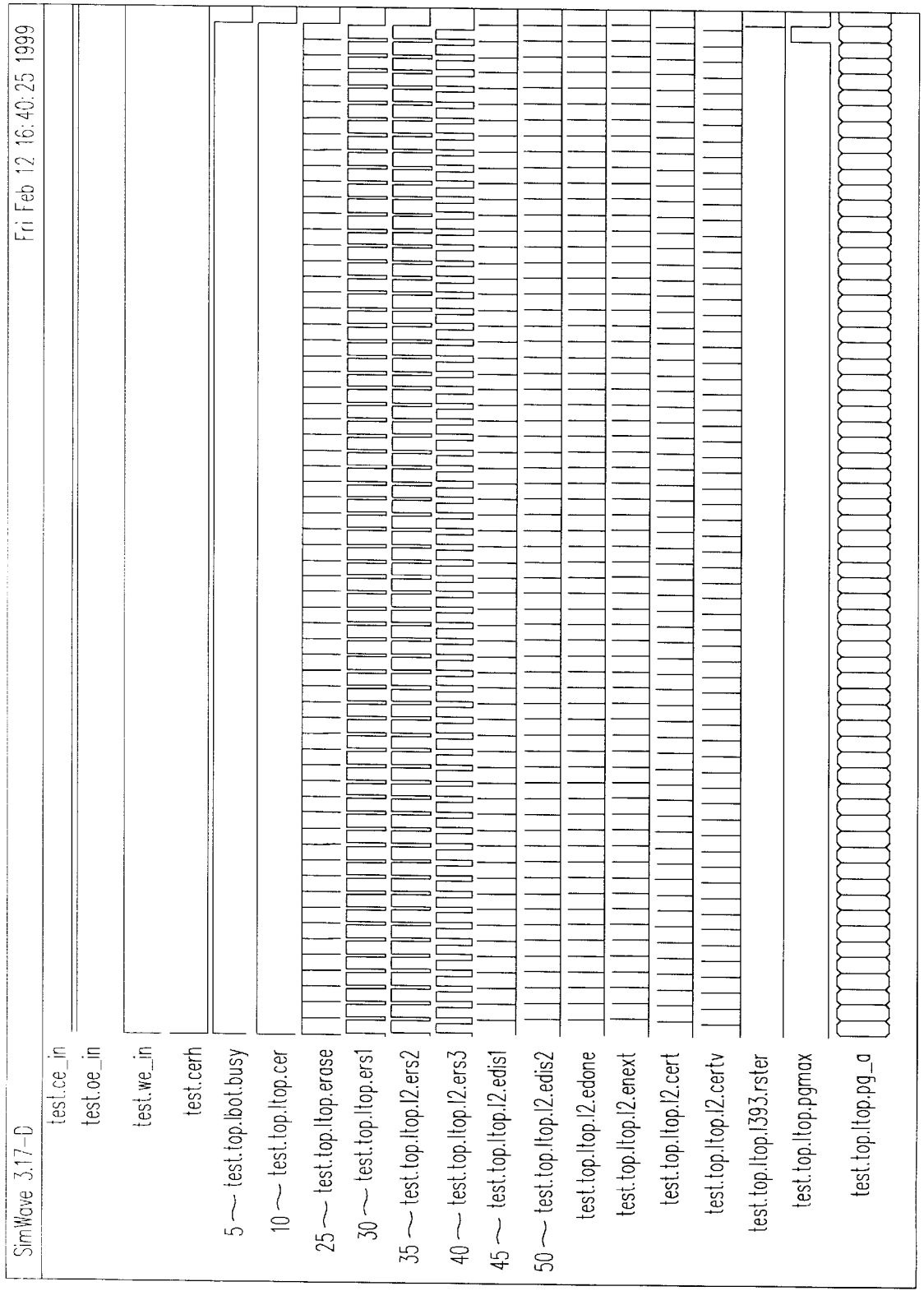
FIG. 8 is another timing diagram showing the logic states of the representative signals during a stage of the cycle-through chip erase method.
Figure 9:
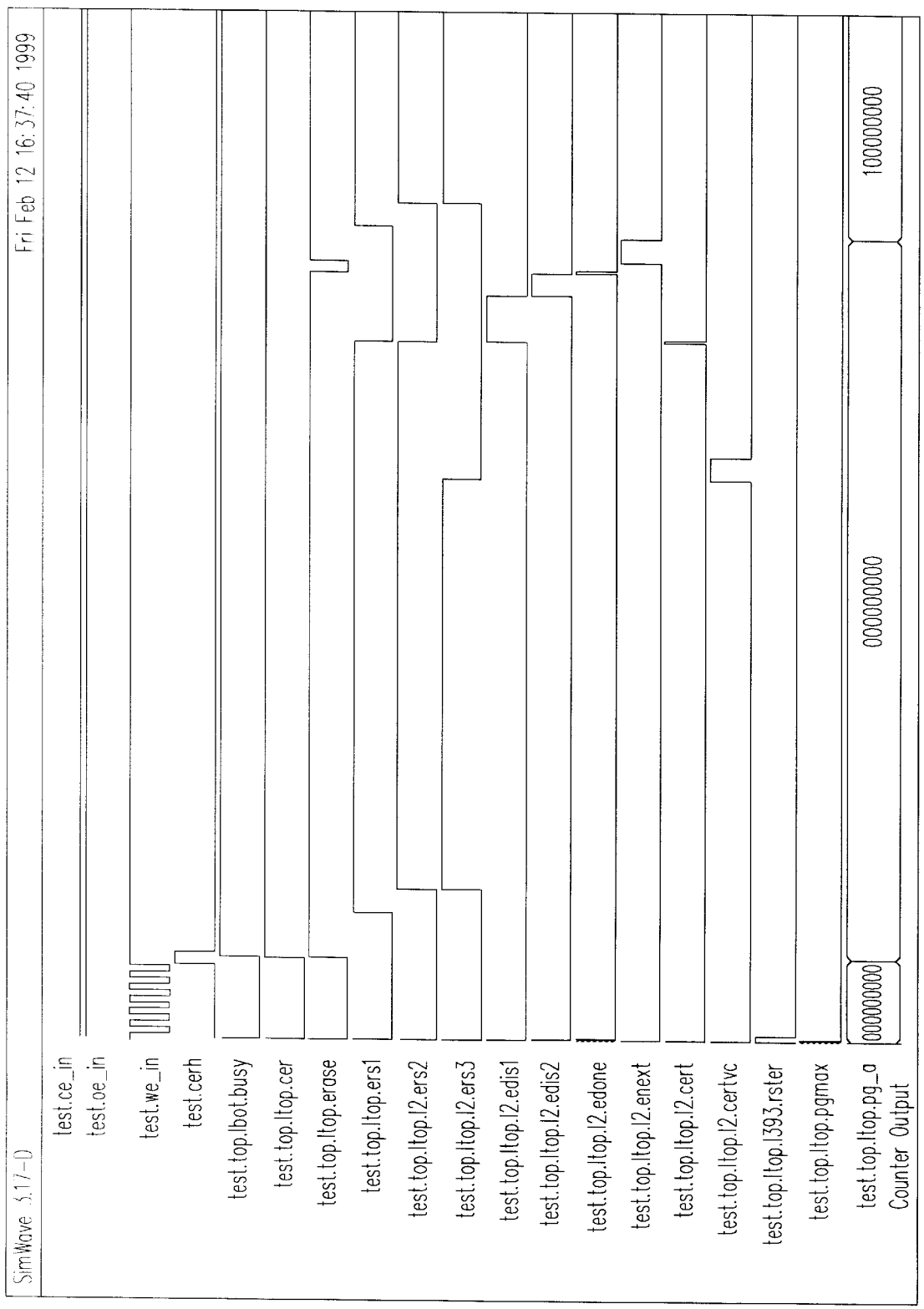
FIG. 9 is a detailed timing diagram of a portion of the timing diagram shown in FIG. 8, in the beginning portion of the erase cycle.
Figure 10:
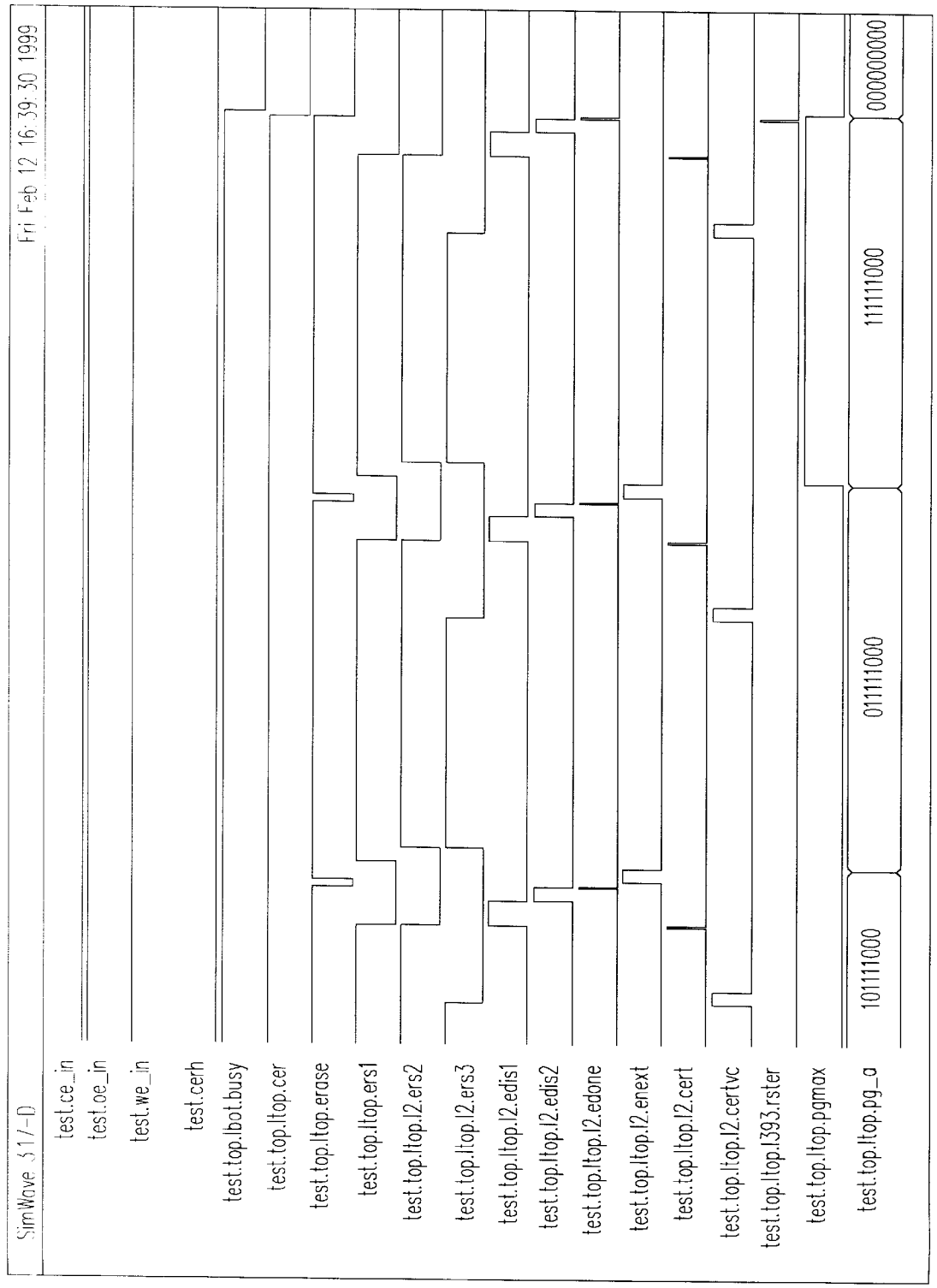
FIG. 10 is a detailed timing diagram of a portion of the timing diagram shown in FIG. 8, in the end portion of the erase cycle.

FIGS. 8–10 show timing diagrams of cycle through chip erase method described in FIG. 2. The signals represented by reference numbers 5, 10, 25, 30, 35, 40, 45, 50, 55, 60, and 65 represent the signals BUSY, CER, ERASE, ERS1, ERS2, ERS3, EDIS1, and EDIS2, EDONE, ENEXT and PGMAX, respectively. The signal PG_A is the sequential address counter output bus signal. In this simulation, there are 64 pages selected by the first six bits ($2^6$=64) of the total of nine bits. The last three bits are not used for page address. FIG. 9 shows the timing diagram of the above signals during the eraseoperation for the first two pages of the erase cycle. FIG. 10 shows the timing diagram of the above signals during the erase operation for the last three two pages of the erase cycle.

Thus, a method and apparatus is provided to decrease the erase current level of a flash memory array by dividing a chip erase operation into two stages. During the first stage, the chip erase current is high and is supplied through a $V_{CC}$ power supply, that can deliver high current, but not high enough voltage to ensure sufficient erasure of memory cells. This current is high enough to supply the current required for band-to-band tunneling current. During the second stage, the erase current is much lower and is supplied through an on-chip charge pump that can deliver much higher voltage than the $V_{CC}$ power supply, to ensure the memory array is properly erased. This higher voltage is sufficient to ensure adequate erasure of the array.

Further, a method and apparatus is provided to decrease the erase current level of a flash memory array by subdividing the memory array into small segments and cycling through complete address space sequentially during chip erase operation. Thus, the transient current is proportionally reduced and is within the current driving capability of an on-chip charge pump when a small segment is chosen.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

For example, these two methods can be combined in a single apparatus that is capable of selectively utilizing each of the chip erase methods described herein.

What is claimed is:

1. A chip erase circuit for erasing an integrated non-volatile memory array circuit device having memory cells of the type susceptible to the generation of band-to-band currents during erase operation, comprising:

(a) timer means in said device for initiating a first and a second period of time;

(b) control means in said device, responsive to said timer means, for applying a first erase current having a first voltage to said non-volatile memory array for said first period of time said first voltage supplied from a source external to said device;

(c) means for increasing said first voltage to a second voltage, higher than said first voltage in said device; and (c) wherein said control means is responsive to said timer means for applying a second erase current, less than said first erase current at said second voltage from said increasing means to said non-volatile memory array for said first and second period of time.

2. The circuit of claim 1 wherein said second erase current is less than said first erase current.

3. A process for erasing a non-volatile memory array having an external voltage supplied thereto and having memory cells of the type susceptible to the generation of band-to-band current during erase operation, comprising:

(a) applying said external voltage having a first erase current for a first period of time to said non-volatile memory array;

(b) amplifying said external voltage to a high voltage greater than said external voltage; and (c) applying said high voltage having a second erase current less than said first erase current for said first period of time and for a second period of time to said memory array.

4. The process for erasing a non-volatile memory array of claim 3, wherein said first voltage is not sufficient to cause erasure of the non-volatile memory array.

5. The process for erasing a non-volatile memory array of claim 4, wherein said second voltage is a level larger than said first voltage to sufficiently erase the non-volatile memory array.

6. A method for erasing memory cells of the type susceptible to the generation of band-to-band current during the erase operation, comprising the steps of:

(a) initiating a first erase timer and a second erase timer;

(b) connecting the memory cells to a first source of a first current level, having a first voltage level and a second source of a second current level lower than said first current level having a second voltage level higher than said first voltage level;

(c) disconnecting the memory cells from said first source after a first time period from said first erase timer;

(d) continuing with the erase operation by the second source and;

(e) terminating said erase operation when said second erase timer has expired.

7. The method of claim 6, wherein said third voltage level is significantly larger than said first voltage level.

* * * * *